United States Patent
Gupta

(10) Patent No.: US 6,813,677 B1
(45) Date of Patent: Nov. 2, 2004

(54) MEMORY DECODER AND METHOD OF OPERATION

(75) Inventor: Vidyabhusan Gupta, Palo Alto, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 623 days.

(21) Appl. No.: 09/586,134

(22) Filed: Jun. 2, 2000

(51) Int. Cl.[7] .............................................. G06F 12/00
(52) U.S. Cl. .............. 711/101; 365/189.07; 365/230.09
(58) Field of Search ...................... 365/230.08, 230.04, 365/230.01, 230.09, 189.04, 189.07; 711/101

(56) References Cited

U.S. PATENT DOCUMENTS

| | | | |
|---|---|---|---|
| 3,889,243 A | * 6/1975 | Drimak ...................... 711/132 |
| 3,991,408 A | 11/1976 | Holmes, Jr. et al. | |
| 4,181,940 A | * 1/1980 | Underwood et al. .......... 714/25 |
| 4,965,770 A | * 10/1990 | Yanagisawa .............. 365/238.5 |
| 5,212,780 A | * 5/1993 | Padgaonkar et al. ... 365/230.04 |
| 5,257,359 A | * 10/1993 | Blasco et al. ................ 711/138 |
| 5,995,993 A | 11/1999 | Liang | |

FOREIGN PATENT DOCUMENTS

JP  06-223597  8/1994

* cited by examiner

*Primary Examiner*—Mano Padmanabhan
*Assistant Examiner*—Thang Ho
(74) *Attorney, Agent, or Firm*—Lisa K. Jorgenson; William A. Munck

(57) ABSTRACT

There is disclosed a memory capable of storing a present value and at least one past value of a variable accessible by a first memory address. The memory comprises a memory block comprising R rows of memory cells and a row address decoder for decoding the first memory address. During a read operation, the row address decoder causes data to be retrieved from a row in which data stored to the first memory address was last written. During a write operation, the row address decoder causes data to be stored in a next-sequential row following the last-written row.

27 Claims, 4 Drawing Sheets

MEMORY DECODER AND METHOD OF OPERATION

TECHNICAL FIELD OF THE INVENTION

The present invention is generally directed to data processors and, more specifically, to a memory circuit capable of storing a current value and previous values of a variable in an address location. The present invention also makes the use of certain non-volatile memories transparent to data processors by making them appear functionally equivalent to standard random access memories.

BACKGROUND OF THE INVENTION

The power and complexity of microprocessors has increased dramatically in the last twenty years. During that same time period, the relative price of microprocessors has decreased. As a result, most of the population is able to afford a desk top personal computer (PC) that is at least as powerful as some mainframe computers from a decade ago.

However, as more and more functions are either expanded in or added to a microprocessor, the ability of a programmer or engineer to debug problems in a microprocessor or problems in software executed by a microprocessor decreases. This happens, in part, because there are a limited number of pins on a microprocessor that can be used to access and examine the internal registers, buses, interfaces, caches, instruction units, functional units, and other components of a microprocessor. For example, in some processor architectures, read and write operations to an on-chip level one (L1) cache are not directly observable on an external pin of the processor.

A number of techniques may be used to debug a conventional microprocessor and/or to debug software executed by a microprocessor. One technique involves editing source code to include unique print statements associated with particular program branches in order to determine the paths the program took during execution. Another technique involves using a debugger, which causes a program to execute to some break point and then halt. This allows a programmer to modify memory, to analyze certain registers (such as debug registers) that are accessible in the microprocessor, and to change break points, if necessary. Program execution may then be resumed.

These types of techniques are often effective for debugging software, but are frequently of limited use in debugging microprocessors. This is because many debugging techniques are intrusive enough to perturb the normal (and erroneous) operation of the microprocessor, thereby preventing the problem from occurring in the first place.

Certain non-volatile memories, also called flash memories or electrically erasable programmable memories (EEPROM) offer enhanced functionality to the data processing system. However, these memories often require special access instructions or procedures which are not used by conventional volatile memories. For instance, a flash memory must be erased in sectors instead of single memory locations. By contrast, a conventional random access memory can be read and written one storage location at a time. The flash memory must be erased before any new values can be overwritten at an already used location. This makes the use of flash memory impractical at the system level, because in order to change the contents of one location, an entire sector must be erased and rewritten.

Therefore, there is a need in the art for improved techniques for debugging microprocessors. In particular, there is a need for systems and methods for debugging a microprocessor that are minimally intrusive into the normal operation of a highly integrated microprocessor. More particularly, there is a need for systems and methods for accessing and examining selected internal components of a microprocessor without excessively perturbing the normal operation of the microprocessor and without requiring the addition of a large number of external pins.

SUMMARY OF THE INVENTION

To address the above-discussed deficiencies of the prior art, it is a primary object of the present invention to provide a memory capable of storing a present value and at least one past value of a variable accessible by a first memory address. In an advantageous embodiment of the present invention, the memory comprises a memory block comprising R rows of memory cells and a row address decoder capable of decoding the first memory address, wherein the row address decoder during a read operation causes data to be retrieved from a row in which data stored to the first memory address was last written and wherein the row address decoder during a write operation causes data to be stored in a next-sequential row following the last-written row.

According to one embodiment of the present invention, the R rows of memory cells are divided into S sub-blocks of rows, each of the S sub-blocks comprising M rows of memory cells, wherein the first memory address accesses a first one of the S sub-blocks of rows.

According to another embodiment of the present invention, the row address decoder comprises a first decoder capable of decoding the first memory address and generating therefrom a sub-block selection signal capable of accessing the first sub-block.

According to still another embodiment of the present invention, the row address decoder comprises a second decoder capable of receiving the sub-block selection signal and generating therefrom a row selection signal capable of accessing one of the next-sequential row and the last-written row in the first sub-block.

According to yet another embodiment of the present invention, the second decoder is further capable of receiving a read/write signal indicating whether a pending memory access operation is a write operation and, if the pending memory access operation is a write operation, generating the row selection signal to allow data to be written to the next-sequential row.

According to a further embodiment of the present invention, the second decoder, if the pending memory access operation is a read operation, generates the row selection signal to allow data to be retrieved from the last-written row.

According to a still further embodiment of the present invention, the memory further comprises a debugging controller coupled to the row address controller and capable of causing the row address controller to sequentially read data from each of the M rows of memory cells in the first sub-block to thereby retrieve the present value and the at least one past value of the variable accessible by the first memory address.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged non-volatile memory.

Figure 1:
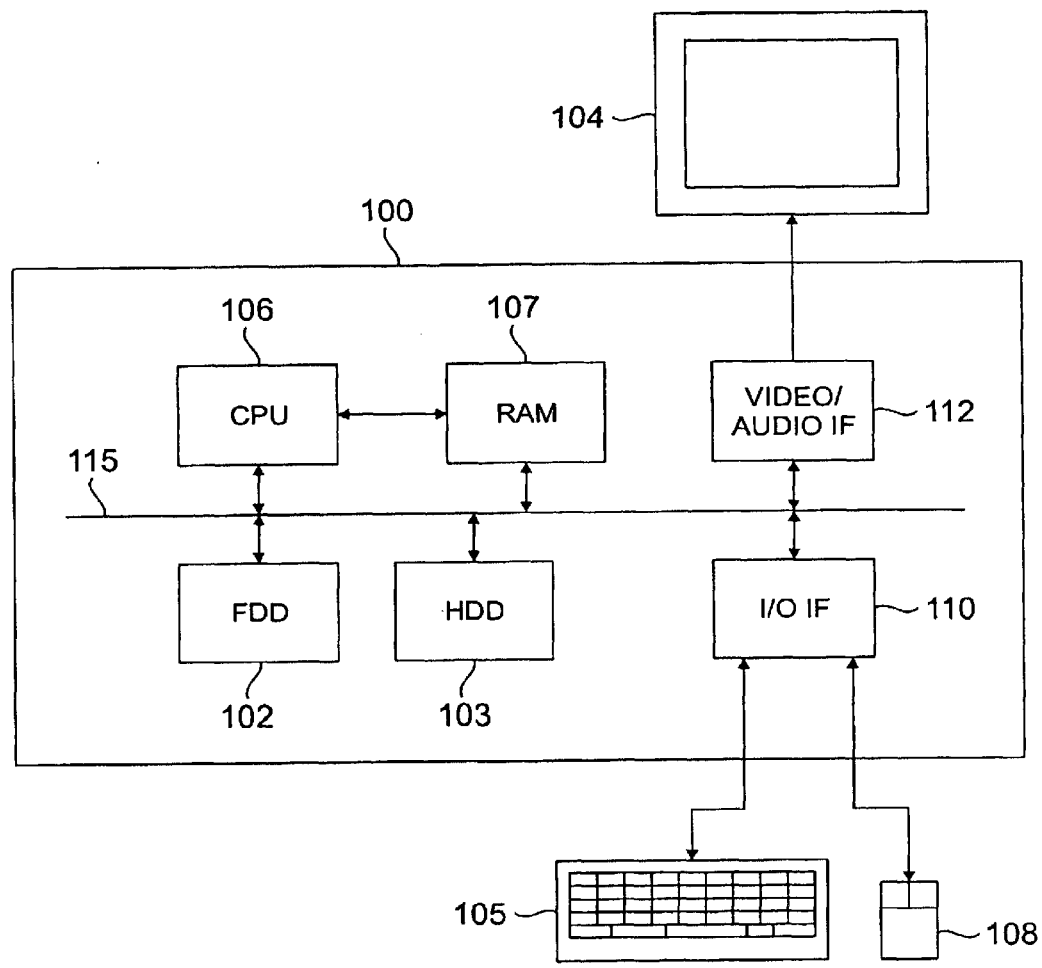
FIG. 1 illustrates an exemplary processing system, namely a personal computer (PC), that contains a non-volatile memory in accordance with the principles of the present invention.

FIG. 1 illustrates an exemplary processing system, namely personal computer (PC) 100, that contains a non-volatile memory in accordance with the principles of the present invention. Personal computer 100 comprises removable (i.e., floppy) disk drive 102 and hard disk drive 103, monitor 104, keyboard 105, processor (CPU) 106, main memory 107, and a pointing device, such as mouse 108. Monitor 104, keyboard 105, and mouse 108 may be replaced by, or combined with, other input/output (I/O) devices. Removable disk drive 102 is capable of reading and writing to removable floppy diskettes. Hard disk drive 105 provides fast access for storage and retrieval of application programs and data.

Keyboard 105 and mouse 108 are coupled to PC 100 via input/output (I/O) interface (IF) 110. Monitor 104 is coupled to PC 100 via video/audio interface (IF) 112. The internal components of PC 100, including floppy disk drive 102, hard disk drive 103, processor 106, main memory 107, I/O interface 110 and video/audio interface 112, are coupled to and communicate across communications bus 115.

In an exemplary embodiment of the present invention, main memory 107 comprises a volatile storage device, such as a dynamic random access memory (RAM). Processor 106 may comprise an on-board two level cache system, including a Level 1 (L1) cache and a Level 2 (L2) cache. The two level cache is a system in which a small, fast cache (the L1 cache) is connected to a slower, larger cache (the L2 cache). When the central processing unit (CPU) core logic of processor 106 reads or writes data to or from a memory location in main memory 107, the cache system first tests to see if the data belonging to that location is in the L1 cache. If the data is in the L1 cache, then the data is provided or updated quickly by the L1 cache. If the data is not in the L1 cache, then an L1 cache read "miss" or an L1 cache write "miss" has occurred.

The data is then provided or updated to the CPU core logic of processor 106 by the L2 cache. In the case of an L1 cache read miss, the line containing the requested data is also transferred from the L2 cache to the L1 cache, so that the data may be provided more quickly the next time processor 106 accesses the data. This is known as an L1 cache line fill. If the data is also not in the L2 cache, then an L2 cache miss has occurred and the line containing the requested data is fetched from main memory 107 and then loaded into the L2 cache for faster access the next time the data is requested. This is known as an L2 cache line fill.

In a preferred embodiment of the present invention, one or more of the electronic memories in PC 100 may comprise an improved memory in accordance with the principles of the present invention. An improved memory according to the present invention is capable of storing a current value of a variable and at least one past value of the variable at a single address location in the memory. A memory according to the principles of the present invention may be implemented in one or more of the internal registers in processor 106, such as the segment registers, debugging registers, data registers, status registers, and the like. A memory according to the principles of the present invention also may be implemented in the L1 cache or the L2 cache in processor 106 or may be implemented in at least part of the address space of main memory 107. In the descriptions of the present invention that follow, the present invention shall be implemented in an exemplary embodiment in main memory 107. However, it should be understood that this is by way of illustration only and the embodiment described below may readily be adapted for use in virtually any type of electronic memory, including those listed above.

Figure 2:
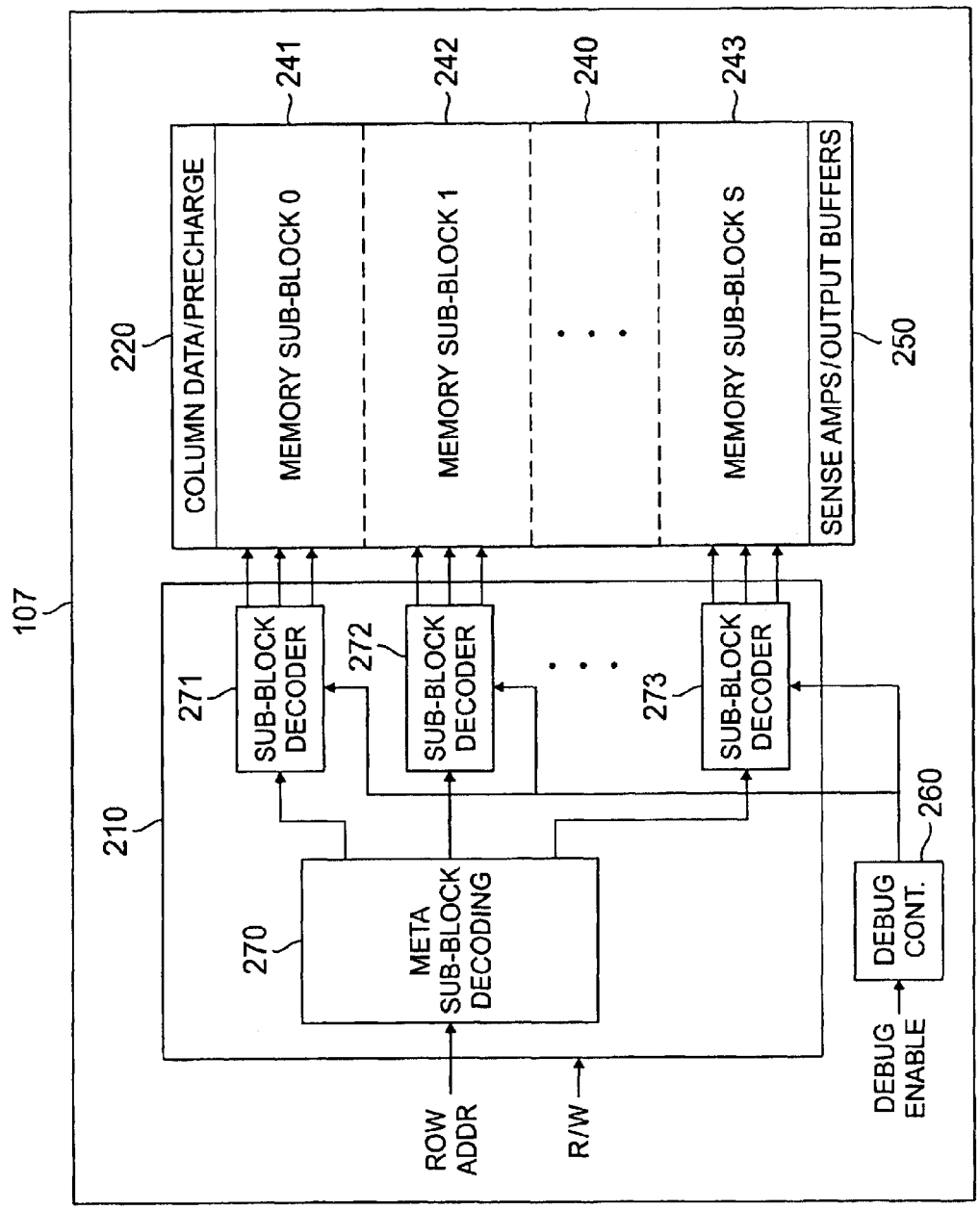
FIG. 2 illustrates in greater detail a main memory in the exemplary PC according to one embodiment of the present invention.

FIG. 2 illustrates in greater detail main memory 107 in exemplary PC 100 according to one embodiment of the present invention. Main memory 107 comprises row decoding circuitry 210, column data/pre-charge circuitry 220, memory block 240, sense amplifiers and output buffers 250, and debug controller 260. Memory block 240 comprises a plurality of memory cells arranged in addressable rows. Data is written into a row of memory cells via column data/precharge circuitry 220 and is read out from a row of memory cells by sense amplifiers and output buffers 250. Memory block 240 is subdivided into S memory sub-blocks, including exemplary memory sub-blocks 241, 242 and 243, which are arbitrarily labeled Memory Sub-Block 0, Memory Sub-Block 1 and Memory Sub-Block S, respectively. Each one of memory sub-blocks 241–243 contains M rows of memory cells that are accessed by the same row address.

Unlike a conventional memory, in which a row decoder accesses a single, unique row for each address, row decoding circuitry 210 does not access a single, unique row for each address. Rather, for each address received, row decoding circuitry 210 sequentially accesses one of the M rows of a selected one of memory sub-blocks 241–243 in memory block 240. The value of M may be varied according to how many past values of a variable a system designer determines are needed in order to debug the operation of processor 106. During a write operation, row decoding circuitry 210 stores the data value in the next sequential unused row of memory cells. During a read operation, row decoding circuitry 210 reads the data value from the current (i.e., last written) row of memory cells.

Exemplary row decoding circuitry 210 comprises meta sub-block decoding circuit 270 and sub-block decoders 271–273. Meta sub-block decoding circuit 270 decodes the incoming row address signal to provide an enabling read or write signal for one of sub-block decoders 271–273. When selected by meta sub-block decoding circuit 270, each of sub-block decoders 271–273 sequentially accesses one of the M rows of memory cells in a corresponding one of memory sub-blocks 241–243. An exemplary, one of sub-block decoders 271–273 is described in greater detail in the following paragraphs.

When processor 106 sets the DEBUG ENABLE signal to the active state, debug controller 260 enters a debug mode of operation in which the M memory locations associated with one or more memory sub-blocks 241–243 may be sequentially read from memory block 240 to processor 106 for analysis purposes. The debug feature provides the ability to track the M most recent values of a variable (i.e., the current value and M−1 past values).

Figure 3:
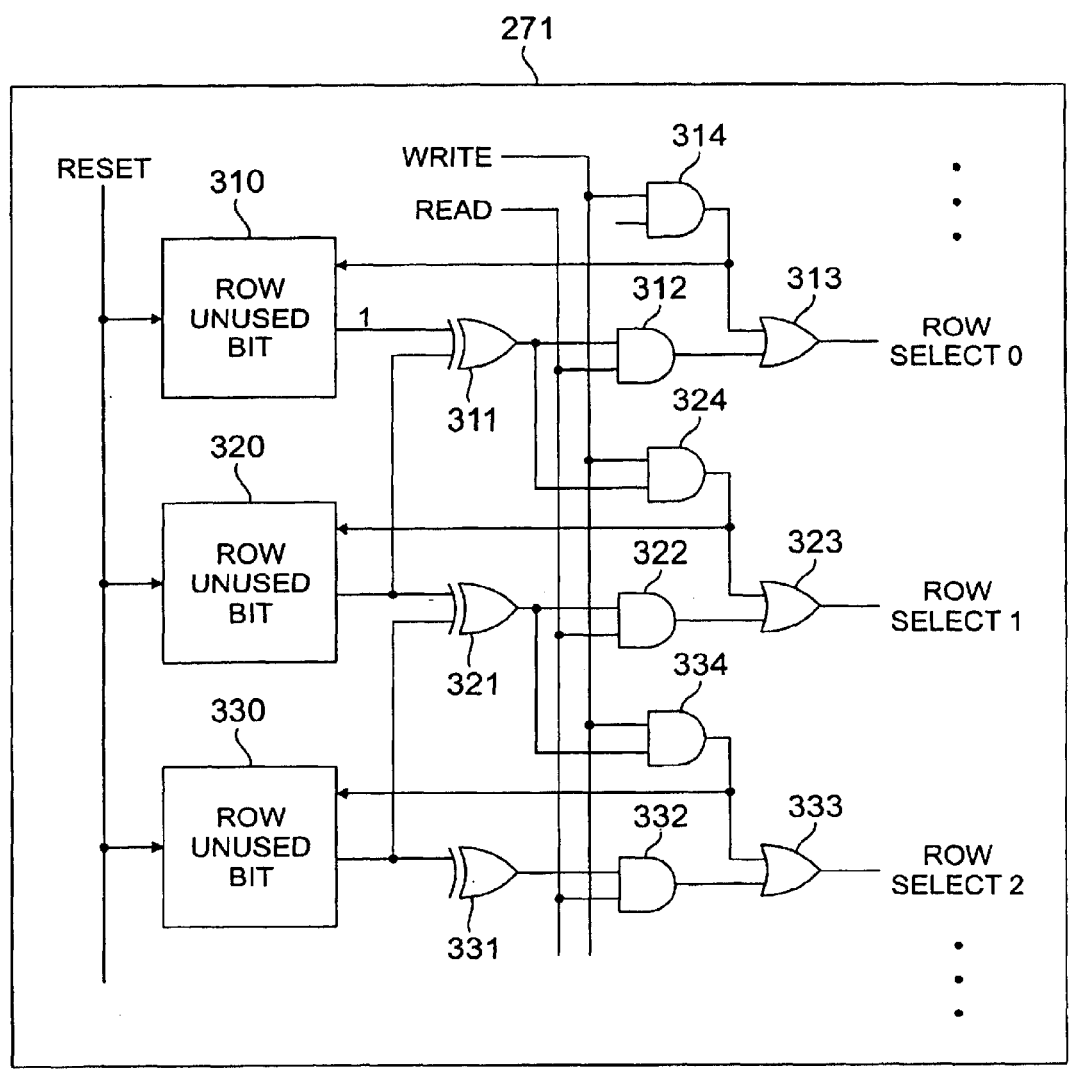
FIG. 3 illustrates an exemplary sub-block decoder in the memory in FIG. 2 according to one embodiment of the present invention.

FIG. 3 illustrates a selected portion of exemplary sub-block decoder 271 in memory 107 according to one embodiment of the present invention. The selected portion of sub-block decoder 271 comprises logic circuits that generate three row select signals, labeled Row Select 0, Row Select 1, and Row Select 2, of the M row select signals that access rows of memory cells in memory sub-block 241. Sub-block decoder 271 comprises row unused bit latch 310, row unused bit latch 320, and row unused bit latch 330. Sub-block decoder 271 also comprises exclusive-OR (XOR) gates 311, 321 and 331, AND gates 312, 322 and 332, OR gates 313, 323 and 333, and AND gates 314, 324 and 334.

During power up or at other selected times, the RESET signal initializes circuits within processor 106, including sub-block decoder 271. The outputs of all row unused bit latches, including row unused bit latches 310, 320, and 330 are set to Logic 0 when the RESET signal is received. These Logic 0 signals set the outputs of XOR gate 311, XOR gate 321, XOR gate 321 to Logic 0. This disables AND gates 312, 322 and 332, and AND gates 314, 324 and 334 and prevent the Read and Write signals from reaching OR gates 313, 323 and 333.

If a row in memory sub-block 241 has not yet been written to, the corresponding row unused bit is at Logic 0. When a write operation occurs in a row in memory sub-block 241, the corresponding row unused bit is set to Logic 1 by one of AND gates 314, 324, or 334. In FIG. 3, a write operation has already activated Row Select 0 and set the output of row unused bit latch 310 to Logic 1. The outputs of row unused bit latches 320 and 330 are still at Logic 0, since a write operation has not yet activated Row Select 1 or Row Select 2. Therefore, the "current" or "last-written" row in memory sub-block 241 is the row accessed by Row Select 0.

Since the output of row unused bit latch 310 is Logic 1 and the output of row unused bit latch 320 is Logic 0, the output of XOR gate 311 is Logic 1, thereby enabling one input on AND gate 312 and one input on AND gate 324. If a Logic 1 pulse is applied to the Read signal, the pulse passes through AND gate 312 and OR gate 313, thereby creating a strobe signal on Row Select 0 (i.e., the current or last-written row). In this manner, the current value of the variable stored in memory sub-block 241 may be read by processor 106.

Alternatively, if a Logic 1 pulse is applied to the Write signal, the pulse passes through AND gate 324 and OR gate 323, thereby creating a strobe signal on Row Select 1 (i.e., the next sequential row). In this manner, the current value of the variable stored in memory sub-block 241 may be written by processor 106, while preserving the past value stored in the row accessed by Row Select 0. At the same time, the pulse that passes through AND gate 324 during the write operation strobes row unused bit latch 320 and sets its output to Logic 1. The Logic 1 on the output of row unused bit latch 320 sets the output of XOR gate 311 to Logic 0, thereby disabling AND gates 312 and 324. At this point, a Read signal can no longer strobe Row Select 0 and a Write signal can no longer strobe Row Select 1.

The Logic 1 on the output of row unused bit latch 320 also sets the output of XOR gate 321 to Logic 1, thereby enabling AND gates 322 and 334. Now, if a Logic 1 pulse is applied to the Read signal, the pulse passes through AND gate 322 and OR gate 323, thereby creating a strobe signal on Row Select 1 (i.e., the "new" current or last-written row). Similarly, if a Logic 1 pulse is applied to the Write signal, the pulse passes through AND gate 334 and OR gate 333, thereby creating a strobe signal on Row Select 2 (i.e., the "new" next sequential row).

The above-described read and write operations may continue through M rows of memory sub-block 241 until data is written to row M or until an active RESET signal is received. In either event, a RESET signal is generated that clears the outputs of all row unused bit latches so that the process may be repeated from the first row in memory sub-block 241.

Figure 4:
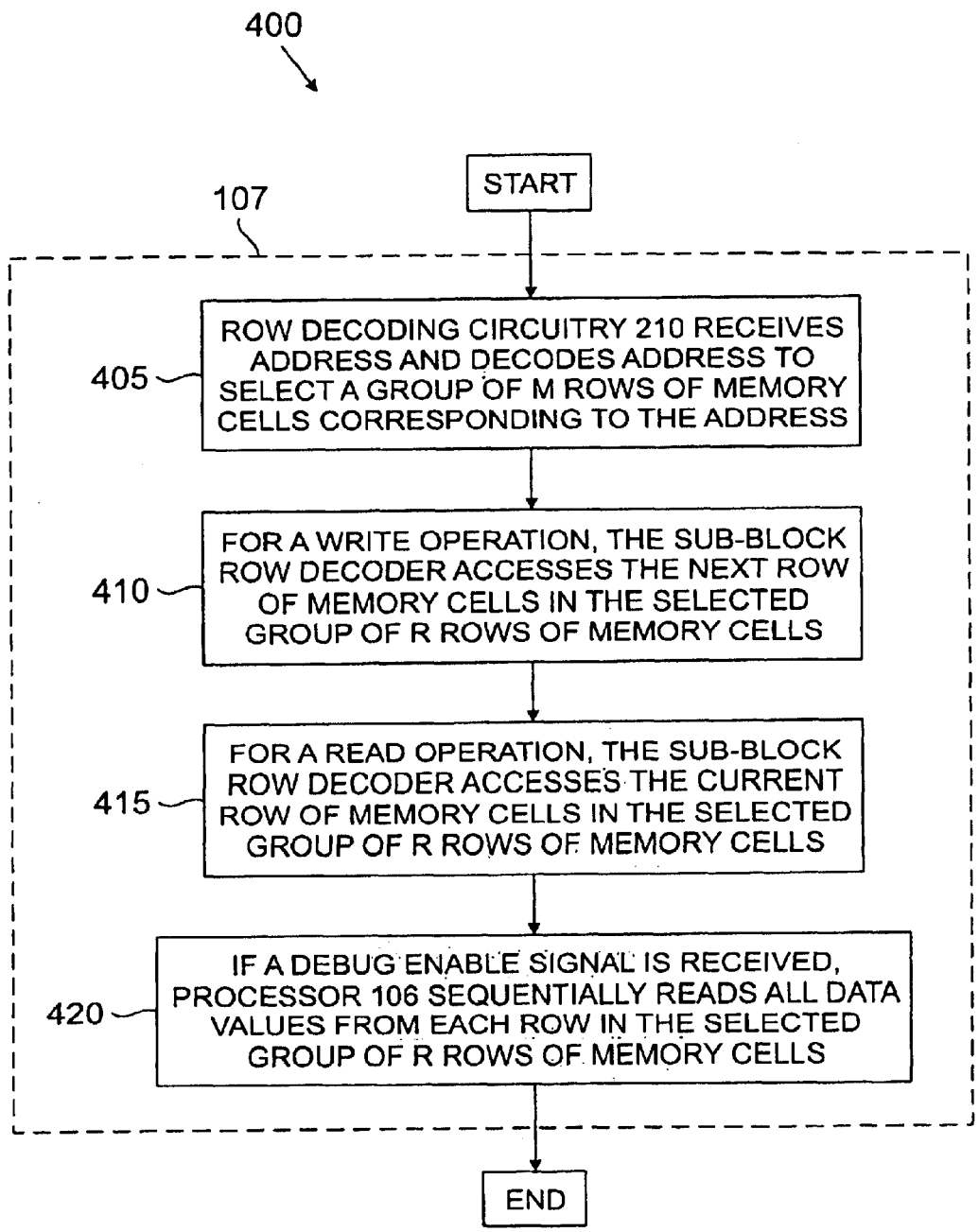
FIG. 4 is a flow diagram illustrating the operation of the exemplary memory according to one embodiment of the present invention.

FIG. 4 depicts flow diagram 400, which illustrates the operation of exemplary main memory 107 according to one embodiment of the present invention. During the course of normal operation, meta sub-block decoding circuit 270 in row decoding circuitry 210 receives and decodes a row address from processor 106. A selected one of sub-block decoders 271–273 associated with the decoded row address enables a group of M rows of memory cells for the next read or write operation (process step 405). During a write operation, the sub-block decoder accesses the next sequential row of memory cells after the last-written row in the selected group of memory cells in order to data to be written (process step 410).

During a read operation, the selected sub-block decoder accesses the current row (i.e., the last-written row) of memory cells in the accessed group of memory cells in order to retrieve the read data (process step 415). If a debug enable signal is received by sub-block decoders 271–273, processor 106 may access one or more sub-blocks of memory cells to sequentially read all data values from each row in the accessed group of memory cells (process step 420).

Although the present invention has been described in detail, those skilled in the art should understand that they can make various changes, substitutions and alterations herein without departing from the spirit and scope of the invention in its broadest form.

What is claimed is:

1. A memory capable of storing a present value and at least one past value of a variable accessible by a first memory address, said memory comprising:
   a memory block comprising R rows of memory cells; and
   a row address decoder capable of decoding said first memory address, wherein said row address decoder during a read operation at said first memory address causes data to be retrieved from a row in which data stored to said first memory address was last written, and wherein said row address decoder during a write operation at said first memory address causes data to be stored in a next-sequential row following said last-written row.

2. The memory as set forth in claim 1 wherein said R rows of memory cells are divided into S sub-blocks of rows, each of said S sub-blocks comprising M rows of memory cells, wherein said first memory address accesses a first one of said S sub-blocks of rows.

3. The memory as set forth in claim 2 wherein said row address decoder comprises a first decoder capable of decoding said first memory address and generating therefrom a sub-block selection signal capable of accessing said first sub-block.

4. The memory as set forth in claim 3 wherein said row address decoder comprises a second decoder capable of receiving said sub-block selection signal and generating therefrom a row selection signal capable of accessing one of said next-sequential row and said last-written row in said first sub-block.

5. The memory as set forth in claim 4 wherein said second decoder is further capable of receiving a read/write signal indicating whether a pending memory access operation is a write operation and, if said pending memory access operation is a write operation, generating said row selection signal to allow data to be written to said next-sequential row.

6. The memory as set forth in claim 5 wherein said second decoder, if said pending memory access operation is a read operation, generates said row selection signal to allow data to be retrieved from said last-written row.

7. The memory as set forth in claim 6 further comprising a debugging controller coupled to said row address controller and capable of causing said row address controller to sequentially read data from each of said M rows of memory cells in said first sub-block to thereby retrieve said present value and said at least one past value of said variable accessible by said first memory address.

8. A data processor comprising:
   a central processing unit (CPU) core logic capable of executing instructions and calculating variables; and
   a storage register capable of storing a present value and at least one past value of a first variable accessible by a first register address, said storage register comprising:
   a storage register comprising R rows of storage cells; and
   a row address decoder capable of decoding said first register address, wherein said row address decoder during a read operation at said first memory address causes data to be retrieved from a row in which data stored to said first register address was last written, and wherein said row address decoder during a write operation at said first memory address causes data to be stored in a next-sequential row following said last-written row.

9. The data processor as set forth in claim 8 wherein said R rows of register cells are divided into S sub-blocks of rows, each of said S sub-blocks comprising M rows of register cells, wherein said first register address accesses a first one of said S sub-blocks of rows.

10. The data processor as set forth in claim 9 wherein said row address decoder comprises a first decoder capable of decoding said first register address and generating therefrom a sub-block selection signal capable of accessing said first sub-block.

11. The data processor as set forth in claim 10 wherein said row address decoder comprises a second decoder capable of receiving said sub-block selection signal and generating therefrom a row selection signal capable of accessing one of said next-sequential row and said last-written row in said first sub-block.

12. The data processor as set forth in claim 11 wherein said second decoder is further capable of receiving a read/write signal indicating whether a pending register access operation is a write operation and, if said pending register access operation is a write operation, generating said row selection signal to allow data to be written to said next-sequential row.

13. The data processor as set forth in claim 12 wherein said second decoder, if said pending register access operation is a read operation, generates said row selection signal to allow data to be retrieved from said last-written row.

14. The data processor as set forth in claim 13 further comprising a debugging controller coupled to said row address controller and capable of causing said row address controller to sequentially read data from each of said M rows of register cells in said first sub-block to thereby retrieve said present value and said at least one past value of said variable accessible by said first register address.

15. A processing system comprising:
   a data processor capable of executing capable of executing application programs and calculating variables associated with said application programs;
   a disk storage device comprising a fixed storage media capable of storing said application programs executed by said data processor and variables; and
   a memory capable of storing a present value and at least one past value of a first variable accessible by a first memory address, said memory comprising:
   a memory block comprising R rows of memory cells; and
   a row address decoder capable of decoding said first memory address, wherein said row address decoder during a read operation at said first memory address causes data to be retrieved from a row in which data stored to said first memory address was last written, and wherein said row address decoder during a write operation at said first memory address causes data to be stored in a next-sequential row following said last-written row.

16. The processing system as set forth in claim 15 wherein said R rows of memory cells are divided into S sub-blocks of rows, each of said S sub-blocks comprising M rows of memory cells, wherein said first memory address accesses a first one of said S sub-blocks of rows.

17. The processing system as set forth in claim 16 wherein said row address decoder comprises a first decoder capable of decoding said first memory address and generating therefrom a sub-block selection signal capable of accessing said first sub-block.

18. The processing system as set forth in claim 17 wherein said row address decoder comprises a second decoder capable of receiving said sub-block selection signal and generating therefrom a row selection signal capable of accessing one of said next-sequential row and said last-written row in said first sub-block.

19. The processing system as set forth in claim 18 wherein said second decoder is further capable of receiving a read/write signal indicating whether a pending memory access operation is a write operation and, if said pending memory access operation is a write operation, generating said row selection signal to allow data to be written to said next-sequential row.

20. The processing system as set forth in claim 19 wherein said second decoder, if said pending memory access operation is a read operation, generates said row selection signal to allow data to be retrieved from said last-written row.

21. The processing system as set forth in claim 20 further comprising a debugging controller coupled to said row address controller and capable of causing said row address controller to sequentially read data from each of said M rows of memory cells in said first sub-block to thereby retrieve said present value and said at least one past value of said variable accessible by said first memory address.

22. For use in a memory comprising R rows of memory cells and capable of storing a present value and at least one past value of a variable accessible by a first memory address, a method of accessing the R rows of memory cells comprising the steps of:

decoding the first memory address;

during a read operation at said first memory address, retrieving data from a row in which data stored to the first memory address was last written; and during a write operation at said first memory address, storing data in a next-sequential row following the last-written row.

23. The method as set forth in claim 22 wherein the R rows of memory cells are divided into S sub-blocks of rows, each of the S sub-blocks comprising M rows of memory cells, wherein the first memory address accesses a first one of the S sub-blocks of rows.

24. The method as set forth in claim 23 wherein the step of decoding comprises the steps of decoding the first memory address and generating therefrom a sub-block selection signal capable of accessing the first sub-block.

25. The method as set forth in claim 24 wherein the step of decoding further comprises the step of decoding the sub-block selection signal and generating therefrom a row selection signal capable of accessing one of the next-sequential row and the last-written row in the first sub-block.

26. The method as set forth in claim 25 wherein the step of decoding further comprises the steps of receiving a read/write signal and determining therefrom whether a pending memory access operation is a write operation and, if the pending memory access operation is a write operation, generating the row selection signal to allow data to be written to the next-sequential row.

27. The method as set forth in claim 26 wherein the step of decoding further comprises the step of, if the pending memory access operation is a read operation, generating the row selection signal to allow data to be retrieved from the last-written row.

* * * * *